(12) United States Patent
Komasaki et al.

(10) Patent No.: US 12,205,873 B2
(45) Date of Patent: *Jan. 21, 2025

(54) ELECTRONIC COMPONENT PACKAGE

(71) Applicant: TDK CORPORATION, Tokyo (JP)

(72) Inventors: Yosuke Komasaki, Tokyo (JP); Hiroshi Naganuma, Tokyo (JP); Naoki Ohta, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/210,291

(22) Filed: Jun. 15, 2023

(65) Prior Publication Data

US 2023/0326839 A1 Oct. 12, 2023

Related U.S. Application Data

(63) Continuation of application No. 16/912,952, filed on Jun. 26, 2020, now Pat. No. 11,721,618.

(30) Foreign Application Priority Data

Jul. 16, 2019 (JP) .................................. 2019-131080

(51) Int. Cl.
*H01L 23/495* (2006.01)
*H01L 23/00* (2006.01)
*H01L 25/03* (2006.01)

(52) U.S. Cl.
CPC .. *H01L 23/49575* (2013.01); *H01L 23/49503* (2013.01); *H01L 23/49562* (2013.01);
(Continued)

(58) Field of Classification Search
CPC ... H01L 23/49575; H01L 24/48; H01L 25/18; H01L 25/16
See application file for complete search history.

(56) References Cited

U.S. PATENT DOCUMENTS 5,126,823 A 6/1992 Otsuka et al.
5,521,432 A 5/1996 Tsuji et al.
(Continued)

FOREIGN PATENT DOCUMENTS

CN 101656247 A 2/2010
JP H03-256353 A 11/1991
(Continued)

OTHER PUBLICATIONS

English translation of Apr. 25, 2024 Office Action issued in German Patent Application No. 102020117731.3.
(Continued)

*Primary Examiner* — Michele Fan
(74) *Attorney, Agent, or Firm* — Oliff PLC

(57) ABSTRACT

An electronic component package has an outer edge including a first side and a second side adjacent to each other. The electronic component package includes a first electronic component chip, a second electronic component chip provided at a distance from the first electronic component chip, one or more first terminals disposed along the first side, one or more second terminals disposed along the second side, and one or more first conductors. The one or more first conductors couple the one or more first terminals to the first electronic component chip, with the one or more first terminals being uncoupled to the second electronic component chip.

15 Claims, 12 Drawing Sheets

(52) U.S. Cl.
CPC .............. *H01L 24/48* (2013.01); *H01L 25/03* (2013.01); *H01L 2224/05554* (2013.01); *H01L 2224/48091* (2013.01); *H01L 2224/48137* (2013.01); *H01L 2224/48247* (2013.01)

(56) References Cited

U.S. PATENT DOCUMENTS

| | | | |
|---|---|---|---|
| 5,596,225 A * | 1/1997 | Mathew | H01L 23/49575 257/667 |
| 7,838,339 B2 | 11/2010 | Tsui et al. | |
| 7,915,719 B2 | 3/2011 | Misumi et al. | |
| 11,721,618 B2 * | 8/2023 | Komasaki | H01L 23/49575 257/676 |
| 2003/0038366 A1 * | 2/2003 | Kozono | H01L 23/3128 361/783 |
| 2005/0110127 A1 | 5/2005 | Kanemoto et al. | |
| 2007/0096284 A1 * | 5/2007 | Wallace | H01L 23/49575 257/E23.038 |
| 2007/0099341 A1 | 5/2007 | Lo | |
| 2008/0105959 A1 | 5/2008 | Tanaka | |
| 2008/0135991 A1 | 6/2008 | Harnden et al. | |
| 2009/0085179 A1 | 4/2009 | Misumi et al. | |
| 2012/0032298 A1 * | 2/2012 | Miyagawa | H01L 23/12 257/E21.599 |
| 2016/0204089 A1 | 7/2016 | Holm et al. | |
| 2019/0035770 A1 | 1/2019 | Iguchi et al. | |
| 2019/0152524 A1 | 5/2019 | Fujita et al. | |
| 2021/0202357 A1 * | 7/2021 | Poddar | H01L 24/45 |
| 2021/0391240 A1 * | 12/2021 | Khanolkar | H01L 24/47 |

FOREIGN PATENT DOCUMENTS

| | | |
|---|---|---|
| JP | H05-211261 A | 8/1993 |
| JP | H06-002713 U | 1/1994 |
| JP | H06-224369 A | 8/1994 |
| JP | 2000-031377 A | 1/2000 |
| JP | 2001-127244 A | 5/2001 |
| JP | 2002-093993 A | 3/2002 |
| JP | 2005-150647 A | 6/2005 |
| JP | 2006-108359 A | 4/2006 |
| JP | 2008-117875 A | 5/2008 |
| JP | 2008-147604 A | 6/2008 |
| JP | 2009-25047 A | 2/2009 |
| JP | 2009-099946 A | 5/2009 |
| JP | 2009-267398 A | 11/2009 |
| JP | 2015-103547 A | 6/2015 |
| JP | 2017-191093 A | 10/2017 |
| WO | 2008/114374 A1 | 9/2008 |

OTHER PUBLICATIONS

Jun. 29, 2021 Office Action issued in Japanese Patent Application No. 2019-131080.

* cited by examiner

ELECTRONIC COMPONENT PACKAGE

CROSS REFERENCE TO RELATED APPLICATIONS

This is a Continuation of U.S. patent application Ser. No. 16/912,952 filed Jun. 26, 2020, which claims the benefit of Japanese Priority Patent Application No. 2019-131080 filed Jul. 16, 2019, the entire contents of which are incorporated herein by reference.

BACKGROUND

The disclosure relates to an electronic component package including two or more electronic component chips that are provided on a single substrate.

A technique has been proposed to implement redundancy in an operation system of an electronic component package, such as a sensor unit, to be mounted on, e.g., an electronic apparatus. For example, reference is made to Japanese Unexamined Patent Application Publication No. 2017-191093.

SUMMARY

An electronic component package according to one embodiment of the disclosure has an outer edge including a first side and a second side adjacent to each other. The electronic component package includes a first electronic component chip, a second electronic component chip provided at a distance from the first electronic component chip, one or more first terminals disposed along the first side, one or more second terminals disposed along the second side, and one or more first conductors that couple the one or more first terminals to the first electronic component chip, with the one or more first terminals being uncoupled to the second electronic component chip.

An electronic component package according to one embodiment of the disclosure includes a substrate, a first electronic component chip, a second electronic component chip, one or more first terminals, one or more second terminals, one or more first conductors, and one or more second conductors. The substrate has a first main surface, a second main surface opposite to the first main surface, and a first end face and a second end face each coupling the first main surface and the second main surface to each other. The first electronic component chip is provided on the first main surface. The second electronic component chip is provided on the second main surface. The one or more first terminals are provided along the first end face. The one or more second terminals are provided along the second end face. The one or more first conductors couple the one or more first terminals to the first electronic component chip. The one or more second conductors couple the one or more second terminals to the second electronic component chip.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
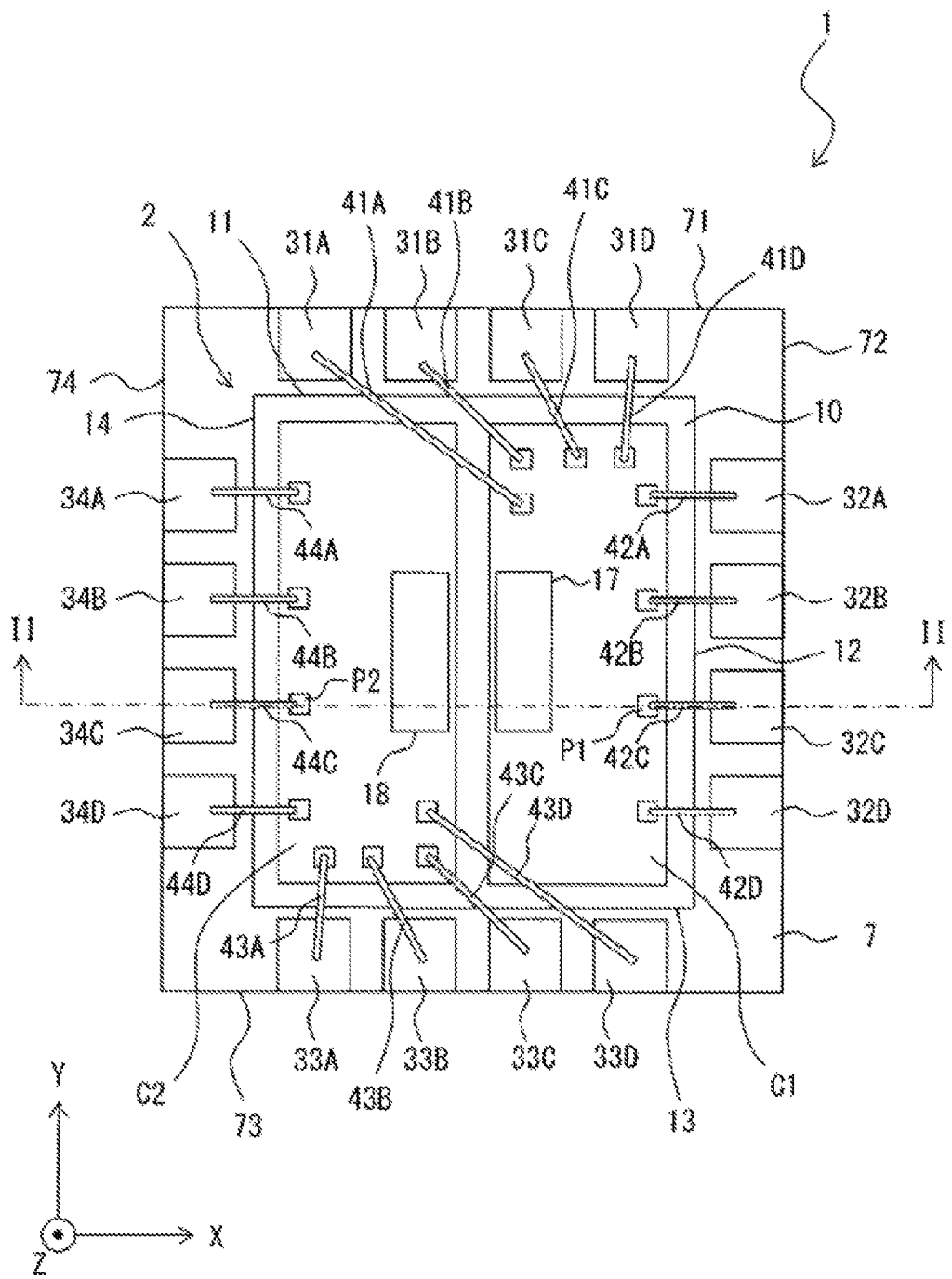
FIG. 1 is a planar diagram illustrating an overall configuration of a sensor package according to one example embodiment of the disclosure.

An electronic component package that implements redundancy in its operation system is desired of further improved operational reliability, as well as size reduction.

It is desirable to provide an electronic component package that achieves improved operational reliability while being small in size.

In the following, some example embodiments and modification examples of the technology are described in detail with reference to the accompanying drawings. Note that the following description is directed to illustrative examples of the technology and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

1. First Example Embodiment (An example of a sensor package including two electronic component chips that are provided on one surface of a substrate)
2. First Modification Example of First Example Embodiment
3. Second Modification Example of First Example Embodiment 4. Third Modification Example of First Example Embodiment
5. Second Example Embodiment (An example of a sensor package including a single electronic component chip provided on each of two opposite surfaces of a substrate)
6. Other Modification Examples

1. First Example Embodiment

[Configuration of Sensor Package 1]

Figure 2:
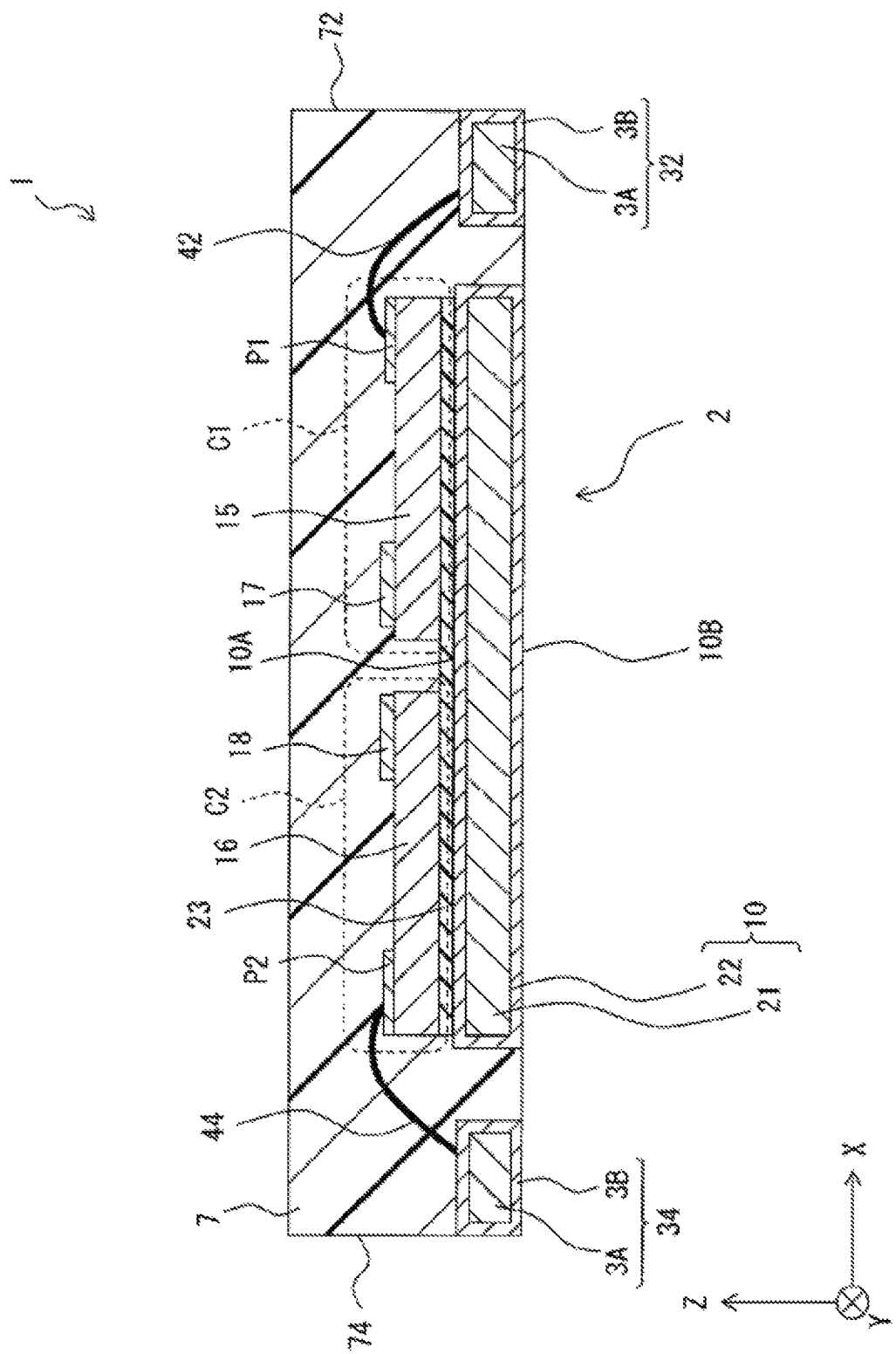
FIG. 2 is a cross-sectional diagram illustrating a configuration in a cross section of the sensor package illustrated in FIG. 1.

First, a configuration of a sensor package 1 according to a first example embodiment of the disclosure will be described with reference to FIG. 1 and FIG. 2. FIG. 1 and FIG. 2 are planar and cross-sectional schematic diagrams, respectively, illustrating an overall configuration example of the sensor package 1. FIG. 2 illustrates a cross section along line II-II in FIG. 1 as viewed in the direction of the arrows. The sensor package 1 may be, for example, a magnetic sensor that detects a variation in a magnetic field. The sensor package 1 is a specific but non-limiting example corresponding to an "electronic component package" in one embodiment of the disclosure.

As illustrated in FIG. 1, the sensor package 1 may include a sensor module 2, first to fourth terminals 31 to 34, and first to fourth leads 41 to 44. The sensor module 2, the first to fourth terminals 31 to 34, and the first to fourth leads 41 to 44 may be embedded in a mold 7. In some embodiments, the sensor package 1 may include one or more first terminals 31 (31A to 31D), one or more second terminals 32 (32A to 32D), one or more third terminals 33 (33A to 33D), one or more fourth terminals 34 (34A to 34D), one or more first leads 41 (41A to 41D), one or more second leads 42 (42A to 42D), one or more third leads 43 (43A to 43D), and one or more fourth leads 44 (44A to 44D). The mold 7 has an outer edge that may be defined by a first side 71, a second side 72, a third side 73, and a fourth side 74. The outer edge of the mold 7 may have a substantially rectangular shape in a plan view. The sensor package 1 has an outer edge. The outer edge of the sensor package 1 may be formed by the outer edge of the mold 7, and may thus have a substantially rectangular shape in a plan view. Note that each of the first to fourth terminals 31 to 34 may be provided with its one main surface and one side surface non-covered with the mold 7, i.e., exposed from the mold 7. Furthermore, a back surface of the sensor module 2, which may correspond to a second main surface 10B of a substrate 10 described later and be provided with neither of an electronic component chip C1 and an electronic component chip C2 described later, may also be exposed from the mold 7. In the sensor package 1, for example, the first side 71 and the third side 73 may be substantially orthogonal to the second side 72 and the fourth side 74. In other words, the first side 71 and the third side 73 may be substantially parallel to each other, and the second side 72 and the fourth side 74 may be substantially parallel to each other.

The mold 7 may be a protective member that may protect, for example, the sensor module 2, the first to fourth terminals 31 to 34, and the first to fourth leads 41 to 44. The mold 7 may include an insulating resin, for example. Non-limiting examples of the insulating resin usable for the mold 7 may include a thermosetting resin in which an epoxy resin is used as a matrix resin and a silica filler is mainly used as a filler and dispersed in the matrix resin. Note that ceramic or glass may be used in place of the mold 7 including the insulating resin.

[Configuration of Sensor Module 2]

Figure 3:
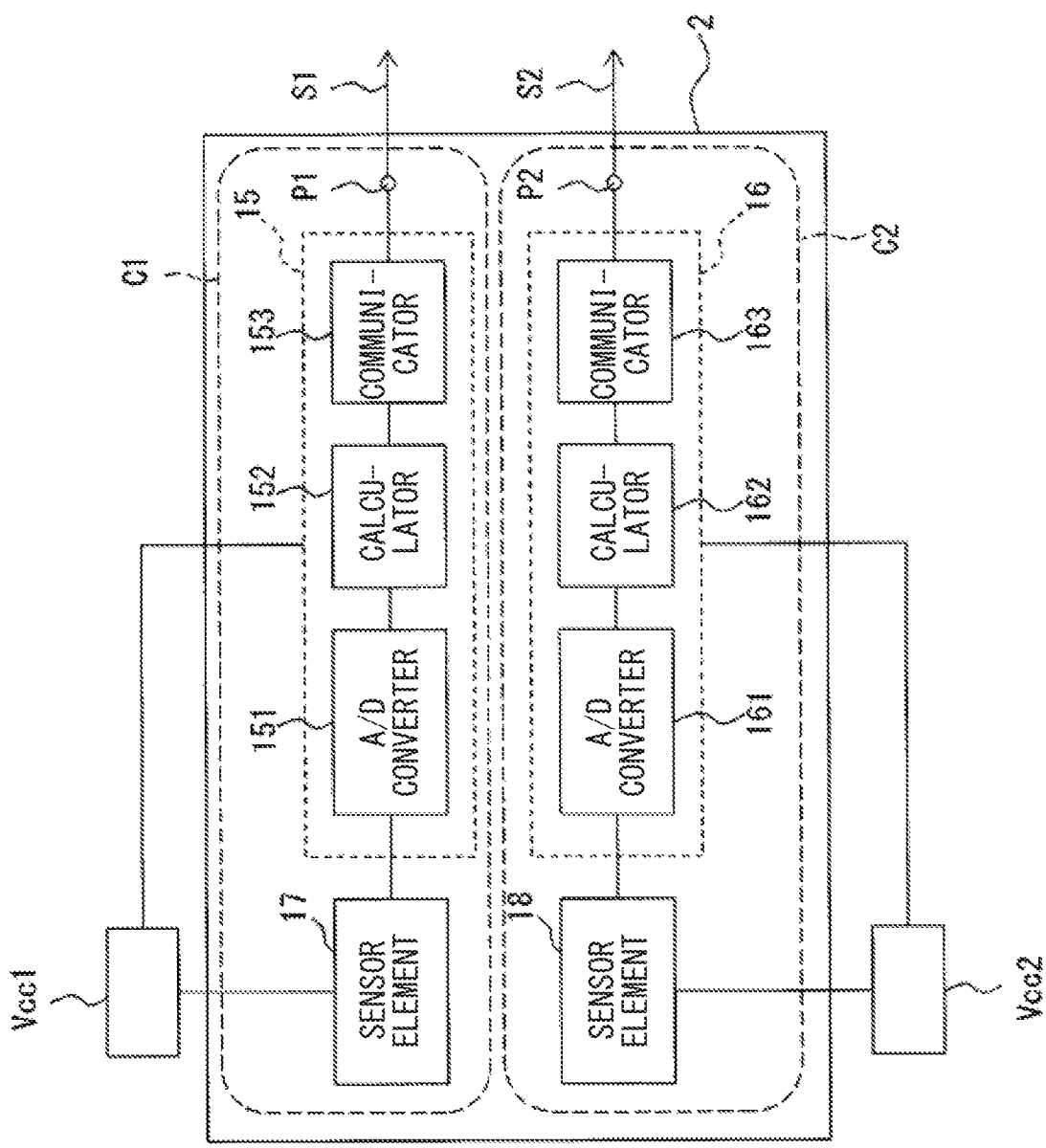
FIG. 3 is a block diagram illustrating a configuration example of the sensor package illustrated in FIG. 1.

As illustrated in FIG. 1 and FIG. 2, the sensor module 2 may include the substrate 10, an insulating layer 23, the electronic component chip C1, and the electronic component chip C2. FIG. 3 illustrates a configuration example of the sensor module 2 in a block diagram.

Note that the substrate 10 is a specific but non-limiting example corresponding to a "substrate" in one embodiment of the disclosure. The electronic component chip C1 and the electronic component chip C2 are specific but non-limiting examples corresponding to a "first electronic component chip" and a "second electronic component chip", respectively, in one embodiment of the disclosure.

[Substrate 10]

The substrate 10 may be a plate-shaped member having a first main surface 10A, and the second main surface 10B opposite to the first main surface 10A. Both the electronic component chip C1 and the electronic component chip C2 may be provided on the first main surface 10A. The electronic component chip C2 is provided at a distance from the electronic component chip C1. The second main surface 10B may not be covered with the mold 7, i.e., may be exposed from the mold 7. The substrate 10 may have an outer edge defined by a first side 11, a second side 12, a third side 13, and a fourth side 14. The outer edge of the substrate 10 may have a substantially rectangular shape in a plan view. The first to fourth sides 11 to 14 of the outer edge of the substrate 10 may be, for example, substantially parallel to the first to fourth sides 71 to 74 of the outer edge of the mold 7, respectively. The electronic component chip C1 and the electronic component chip C2 may be adjacent to each other in an X-axis direction along the first side 11 and the first side 71, and may each extend in a Y-axis direction along the second side 12 and the second side 72.

The substrate 10 may have a two-layer structure including a base 21 and a plating layer 22. The base 21 may be, for example, a plate member or a foil member including an electrically conductive material such as copper. The plating layer 22 may be a coating film including a metal material formed to, for example, integrally cover a surface of the base 21. Note that the plating layer 22 may be formed to cover only a portion of the base 21.

The plating layer 22 may include a metal material that is less likely to undergo an ion migration phenomenon than silver (Ag), for example. In a specific but non-limiting example, the plating layer 22 may include a metal material that includes one or more of gold (Au), palladium (Pd), and nickel (Ni). The plating layer 22 may have either a single-layer structure including the above-described metal material, or a multi-layer structure including a plurality of layers stacked. In an example embodiment, the multi-layer structure may be, for example, an Ni/Au two-layer structure, an Ni—P (nickel-phosphorus alloy)/Au two-layer structure, or an Ni/Pd/Au three-layer structure.

It is possible to evaluate the plating layer 22 for ion migration by using, for example, an unsaturated pressurized water vapor test referred to as highly accelerated temperature humidity stress test (HAST). Specific test conditions are specified, for example, in International Electrotechnical Commission (IEC) standard Nos. 60068-2-66 and 60749-4. The wording "metal material that is less likely to undergo an ion migration phenomenon than silver (Au)" as used in the present example embodiment refers to a metal material that takes a longer time as compared to silver (Ag) or that does not undergo breakdown in: a case where HAST is carried out for 192 hours within a temperature range of 110±2° C. and within a humidity range of 85±5% RH; a case where HAST is carried out for 96 hours within a temperature range of 120±2° C. and within a humidity range of 85±5% RH; or a case where HAST is carried out for 48 hours within a temperature range of 130±2° C. and within a humidity range of 85±5% RH.

[Insulating Layer 23]

The insulating layer 23 may be provided on the first main surface 10A. The insulating layer 23 may be an insulating adhesive film, i.e., a die attach film (DAF), for example. The insulating layer 23 may thus bond and fix each of the electronic component chip C1 and the electronic component chip C2 to the base 21 covered with the plating layer 22. The electronic component chip C1 and the electronic component chip C2 may be electrically separated from each other because of the presence of the insulating layer 23 and of the mold 7 that seals the entire sensor module 2. Note that the insulating layer 23 may be replaced with any electrically conductive adhesive layer of a material that is able to bond the electronic component chips C1 and C2 to the substrate 10. However, from a viewpoint of reducing a risk of simultaneous failures of the electronic component chips C1 and C2, an insulating adhesive layer like the insulating layer 23 may be used in an example embodiment.

[Electronic Component Chip C1 and Electronic Component Chip C2]

The electronic component chip C1 and the electronic component chip C2 may be devices of the same type having substantially the same function or the same structure, for example. However, the electronic component chip C1 and the electronic component chip C2 may have different structures while having the same function. Alternatively, the electronic component chip C1 and the electronic component chip C2 may be devices of different types that are different from each other in, for example, function and structure.

As illustrated in FIG. 2, the electronic component chip C1 may be provided on the plating layer 22 with the insulating layer 23 interposed therebetween. As illustrated in FIGS. 2 and 3, the electronic component chip C1 may include an application-specific integrated circuit (ASIC) 15, a sensor element 17, and a plurality of pads P1. In an example illustrated in FIG. 1, the electronic component chip C1 may include eight pads P1. The ASIC 15 and the sensor element 17 are specific but non-limiting examples corresponding to a "first application-specific integrated circuit" and a "first sensor", respectively, in one embodiment of the disclosure. Although not illustrated, the sensor element 17 and the ASIC 15 may be electrically coupled to each other. As illustrated in FIG. 2, the electronic component chip C2 may be provided on the plating layer 22 with the insulating layer 23 interposed therebetween. As illustrated in FIGS. 2 and 3, the electronic component chip C2 may include an ASIC 16, a sensor element 18, and a plurality of pads P2. In an example illustrated in FIG. 1, the electronic component chip C2 may include eight pads P2. The ASIC 16 and the sensor element 18 are specific but non-limiting examples corresponding to a "second application-specific integrated circuit" and a "second sensor", respectively, in one embodiment of the disclosure. Although not illustrated, the sensor element 18 and the ASIC 16 may be electrically coupled to each other. For example, an electrically conductive wire, an electrically conductive bump, or an electrically conductive thin film such as a plating film may be used to electrically couple the sensor element 17 and the ASIC 15 to each other, and to electrically couple the sensor element 18 and the ASIC 16 to each other. The electrically conductive wire, the electrically conductive bump, and the electrically conductive thin film may each include metal such as gold (Au), Al (aluminum), or copper (Cu), for example. Further, in the sensor package 1, as illustrated in FIG. 3, a power supply Vcc1 that supplies power to the electronic component chip C1 and a power supply Vcc2 that supplies power to the electronic component chip C2 may be coupled to the electronic component chip C1 and the electronic component chip C2, respectively. The power supply Vcc1 may be coupled to each of the ASIC 15 and the sensor element 17 of the electronic component chip C1. The power supply Vcc2 may be coupled to each of the ASIC 16 and the sensor element 18 of the electronic component chip C2.

[Sensor Element 17 and Sensor Element 18]

The sensor element 17 and the sensor element 18 may each be, for example, a magnetic sensor that detects a variation in an external magnetic field associated with a displacement of a magnetic body. Non-limiting examples of the sensor element 17 and the sensor element 18 may include a Hall element, an anisotropic magneto-resistive effect (AMR) element, a giant magneto-resistive effect (GMR) element, and a tunneling magneto-resistive effect (TMR) element. The sensor element 17 and the sensor element 18 may transmit detection signals associated with the variation in the external magnetic field to the ASIC 15 and the ASIC 16, respectively.

[ASIC 15 and ASIC 16]

As illustrated in FIG. 3, the ASIC 15 may include, for example, an A/D converter 151, a calculator 152, and a communicator 153. The A/D converter 151 may perform digital conversion of a detection signal supplied from the sensor element 17, and may output the digital-converted detection signal to the calculator 152. The calculator 152 may determine, for example, an amount of displacement of the magnetic body through an arithmetic operation on the basis of the digital-converted detection signal supplied from the sensor element 17. The calculator 152 may then output a result of the arithmetic operation to the communicator 153. The communicator 153 may generate an output signal of the arithmetic operation result supplied from the calculator 152, and may output the generated output signal to the outside via the pads P1. Likewise, the ASIC 16 may include, for example, an A/D converter 161, a calculator 162, and a communicator 163. The A/D converter 161 may perform digital conversion of a detection signal supplied from the sensor element 18, and may output the digital-converted detection signal to the calculator 162. The calculator 162 may determine, for example, an amount of displacement of the magnetic body through an arithmetic operation on the basis of the digital-converted detection signal supplied from the sensor element 18. The calculator 162 may then output a result of the arithmetic operation to the communicator 163. The communicator 163 may generate an output signal of the arithmetic operation result supplied from the calculator 162, and may output the generated output signal to the outside via the pads P2.

[First Terminal 31 and Second Terminal 32]

The first terminals 31 and the second terminals 32 may each be an electrically conductive member to derive the output signal supplied from the electronic component chip C1 to the outside. The first terminals 31 and the second terminals 32 may each include, for example, a core 3A including a highly electrically conductive material such as copper (Cu), and a cladding 3B covering around the core 3A. The cladding 3B may be, for example, a plating layer having the same structure as the plating layer 22. The cladding 3B may cover the entire circumference of the core 3A or may cover only a portion of the circumference of the core 3A. Furthermore, the cladding 3B may be a plating layer including tin (Sn) which has good solder wettability. FIG. 1 illustrates four first terminals 31 (31A to 31D) arranged along the first side 11 (71) and four second terminals 32 (32A to 32D) arranged along the second side 12 (72). However, each of the number of the first terminals 31 and the number of the second terminals 32 is not limited to four but is selectable from any numbers greater than or equal to one.

[First Lead 41 and Second Lead 42]

The first terminals 31A to 31D may be coupled to corresponding ones of the pads P1 via the first leads 41 (41A to 41D) embedded in the mold 7, respectively. Likewise, the second terminals 32A to 32D may be coupled to corresponding ones of the pads P1 via the second leads 42 (42A to 42D) embedded in the mold 7, respectively. The first leads 41A to 41D and the second leads 42A to 42D may each be what is called a bonding wire having a diameter on the order of several tens of micrometers to several hundreds of micrometers. The first leads 41A to 41D and the second leads 42A to 42D may each include, for example, gold (Au), silver (Ag), copper (Cu), or aluminum (Al). In one embodiment of the disclosure, the first leads 41 are a specific but non-limiting example corresponding to "one or more first conductors", and the second leads 42 are a specific but non-limiting example corresponding to "one or more second conductors".

As illustrated in FIG. 1, the first terminals 31A to 31D disposed along the first side 11 (71) are all coupled to the electronic component chip C1 by the first leads 41A to 41D while being uncoupled to the electronic component chip C2. Likewise, the second terminals 32A to 32D disposed along the second side 12 (72) may all be coupled to the electronic component chip C1 by the second leads 42A to 42D while being uncoupled to the second electronic component chip C2.

[Third Terminal 33 and Fourth Terminal 34]

The third terminals 33 and the fourth terminals 34 may each be an electrically conductive member to derive the output signal supplied from the electronic component chip C2 to the outside. Like the first terminals 31 and the second terminals 32, the third terminals 33 and the fourth terminals 34 may each include, for example, a core 3A including a highly electrically conductive material such as copper (Cu), and a cladding 3B covering around the core 3A. In the third terminals 33 and the fourth terminals 34 also, the cladding 3B may cover the entire circumference of the core 3A or may cover only a portion of the circumference of the core 3A. The cladding 3B may be a plating layer including tin (Sn) which has good solder wettability. FIG. 1 illustrates four third terminals 33 (33A to 33D) arranged along the third side 73 and four fourth terminals 34 (34A to 34D) arranged along the fourth side 74. However, each of the number of the third terminals 33 and the number of the fourth terminals 34 is not limited to four but is selectable from any numbers greater than or equal to one.

[Third Lead 43 and Fourth Lead 44]

The third terminals 33A to 33D may be coupled to corresponding ones of the pads P2 via the third leads 43 (43A to 43D) embedded in the mold 7, respectively. Likewise, the fourth terminals 34A to 34D may be coupled to corresponding ones of the pads P2 via the fourth leads 44 (44A to 44D) embedded in the mold 7, respectively. The third leads 43A to 43D and the fourth leads 44A to 44D may each be what is called a bonding wire having a diameter on the order of several tens of micrometers to several hundreds of micrometers. The third leads 43A to 43D and the fourth leads 44A to 44D may each include, for example, gold (Au), silver (Ag), copper (Cu), or aluminum (Al). In one embodiment of the disclosure, the third leads 43 are a specific but non-limiting example corresponding to "one or more third conductors", and the fourth leads 44 are a specific but non-limiting example corresponding to "one or more fourth conductors".

As illustrated in FIG. 1, the third terminals 33A to 33D disposed along the third side 73 may all be coupled to the electronic component chip C2 by the third leads 43A to 43D while being uncoupled to the electronic component chip C1. Likewise, the fourth terminals 34A to 34D disposed along the fourth side 74 may all be coupled to the electronic component chip C2 by the fourth leads 44A to 44D while being uncoupled to the electronic component chip C1.

[Example Effects of Sensor Package 1]

In the sensor package 1, the electronic component chip C1 and the electronic component chip C2 electrically insulated from each other may be provided on the single substrate 10. Further, the electronic component chip C1 and the electronic component chip C2 may be supplied with electric power separately and respectively from the power supply Vcc1 and the power supply Vcc2 that are different from each other. This enables the electronic component chip C1 and the electronic component chip C2 to detect, independently of each other, a variation in the external magnetic field that is imparted on the sensor package 1 and is associated with a displacement of the magnetic body, for example. Hence, the sensor package 1 achieves redundancy of its operation system. That is, for example, it is possible for the sensor package 1 to cause only the electronic component chip C1 to operate in normal time and to cause the electronic component chip C2 to stand by as a backup. In a case where a malfunction or a failure is suspected in the electronic component chip C1, it is possible for the sensor package 1 to cause the electronic component chip C2 as the backup to operate.

Furthermore, the sensor package 1 is able to provide excellent measurement accuracy even in a case of measuring a physical quantity dependent on the position, such as a magnetic field strength. One reason for this is that in the sensor package 1 it is possible to dispose the electronic component chip C1 and the electronic component chip C2 in close proximity to each other, which makes it possible to reduce a position-dependent error in each of a measurement value of the physical quantity obtained by the electronic component chip C1 and a measurement value of the physical quantity obtained by the electronic component chip C2.

In the sensor package 1, furthermore, all the terminals provided along the same side may be coupled to the same electronic component chip. For example, all the first terminals 31A to 31D arranged along the first side 11 (71) are coupled to the electronic component chip C1 while being uncoupled to the electronic component chip C2. Likewise, all the second terminals 32A to 32D arranged along the second side 12 (72) may be coupled to the electronic component chip C1 while being uncoupled to the electronic component chip C2. Further, all the third terminals 33A to 33D arranged along the third side 13 (73), and all the fourth terminals 34A to 34D arranged along the fourth side 14 (74) may be coupled to the electronic component chip C2 while being uncoupled to the electronic component chip C1. This makes it possible to reduce a risk of occurrence of a short circuit between the electronic component chip C1 and the electronic component chip C2 even in the event of occurrence of, for example, a contact between the first leads 41A to 41D, a contact between the second leads 42A to 42D, a contact between the third leads 43A to 43D, or a contact between the fourth leads 44A to 44D. Therefore, in a case where the electronic component chip C1 and the electronic component chip C2 are of the same type with substantially the same function or the same structure, it is possible to reduce a risk of simultaneous malfunctions or failures of the electronic component chip C1 and the electronic component chip C2. Furthermore, coupling all the terminals provided along the same side to the same electronic component chip makes it possible to reduce the risk of simultaneous malfunctions or failures occurring due to whisker growth or squeezing out of solder.

Furthermore, in the sensor package 1 the first terminals 31 may be disposed along the first side 11 of the substrate 10, the second terminals 32 may be disposed along the second side 12 of the substrate 10, the third terminals 33 may be disposed along the third side 13 of the substrate 10, and the fourth terminals 34 may be disposed along the fourth side 14 of the substrate 10. This makes it possible to dispose a larger number of terminals (the first to fourth terminals 31 to 34) while avoiding an increase in a planar area of the substrate 10.

Figure 9:
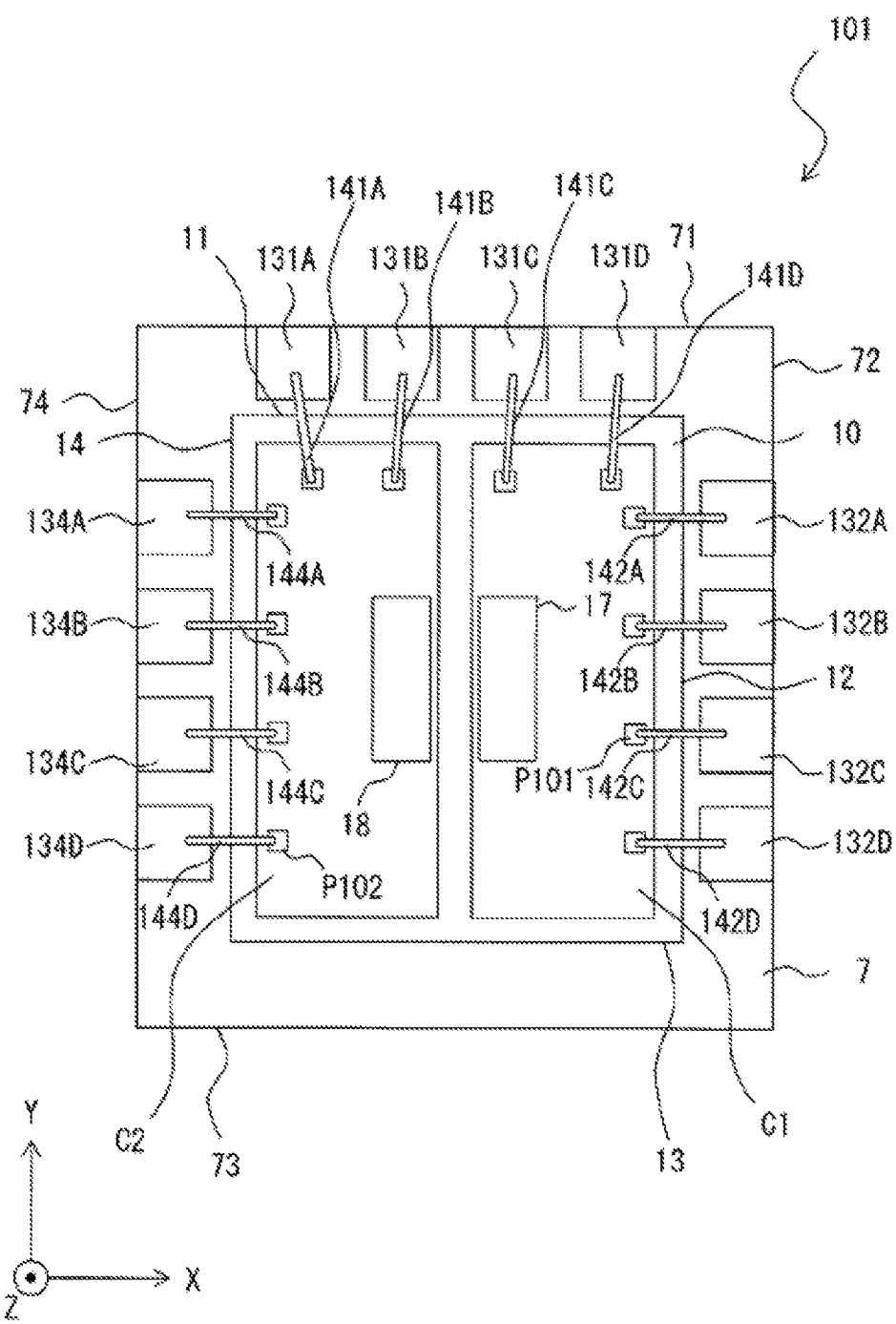
FIG. 9 is a planar diagram illustrating an overall configuration of a sensor package according to a first reference example.

In contrast, for example, in a sensor package 101 illustrated in FIG. 9 according to a reference example, first terminals 131A and 131B may be coupled to pads P102 of the electronic component chip C2 by first leads 141A and 141B, respectively, and first terminals 131C and 131D disposed to be adjacent to the first terminals 131A and 131B along the same first side 11 (71) may be coupled to pads P101 of the electronic component chip C1 by first leads 141C and 141D, respectively. In such a case, a short circuit can tend to occur between the first lead 141B and the first lead 141C. This results in a higher risk of occurrence of a short circuit between the electronic component chip C1 and the electronic component chip C2 as compared with any embodiment of the disclosure. To avoid a short circuit between the first lead 141B and the first lead 141C, it is necessary to increase the distance between the first terminal 131B and the first terminal 131C, which can lead to an increase in planar dimensions. Note that in the sensor package 101, second terminals 132A to 132D disposed along the second side 12 (72) may be coupled to the pads P101 of the electronic component chip C1 by second leads 142A to 142D, respectively. Further, fourth terminals 134A to 134D disposed along the fourth side 14 (74) may be coupled to the pads P102 of the electronic component chip C2 by fourth leads 144A to 144D, respectively.

Figure 10:
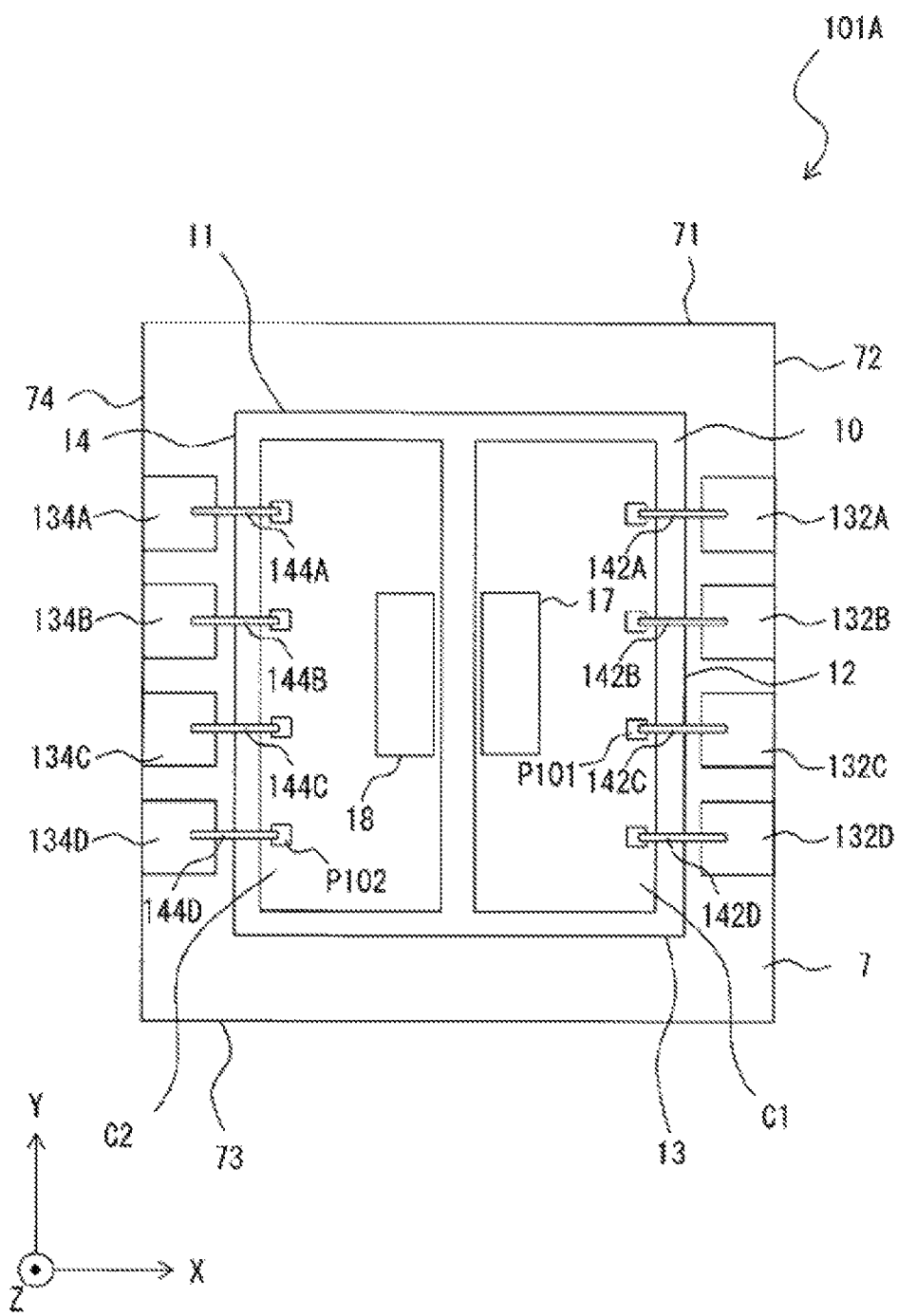
FIG. 10 is a planar diagram illustrating an overall configuration of a sensor package according to a second reference example.

Furthermore, in another sensor package 101A illustrated in FIG. 10 according to a reference example, the second terminals 132A to 132D and the fourth terminals 134A to 134D may be provided along, among the first to fourth sides 11 to 14 (71 to 74), only two sides opposed to each other, for example, the second side 12 (72) and the fourth side 14 (74), and may be coupled to the pads P101 and the pads P102, respectively, by the second leads 142A to 142D and the fourth leads 144A to 144D. In such a case, a short circuit between the electronic component chip C1 and the electronic component chip C2 is less likely to occur. However, attempting to further increase the number of the second terminals 132 or the number of the fourth terminals 134 can lead to a larger planar area of the substrate 10 and a larger planar area of the sensor package 101A, as compared with any embodiment of the disclosure.

In the sensor package 1, the surface of the base 21 may be covered with the plating layer 22 including the metal material that is less likely to undergo the ion migration phenomenon than silver (Ag). Here, a difference in working voltage between the electronic component chip C1 and the electronic component chip C2 results in occurrence of an electric potential difference between the ASIC 15 of the electronic component chip C1 and the ASIC 16 of the electronic component chip C2. Under such a circumstance, in a case where, for example, the plating layer 22 includes a metal material including silver (Ag), there is a concern that the ion migration phenomenon may possibly occur depending on temperature conditions or humidity conditions. In other words, there is a possibility that silver (Ag) included in the plating layer 22 is permeated through the insulating layer 23 to move to the ASIC 15 or the ASIC 16. The occurrence of such ion migration impairs electric insulation of the insulating layer 23, causing occurrence of a leakage current, thus making it difficult to expect a normal operation in each of the electronic component chip C1 and the electronic component chip C2. In contrast, in the sensor package 1 of an example embodiment, the above-described metal material included in the plating layer 22 is less likely to infiltrate into the insulating layer 23 to damage the insulation of the insulating layer 23, as compared with a case where the plating layer 22 includes silver (Ag). Accordingly, even in a case where there is a difference in working voltage between the electronic component chip C1 and the electronic component chip C2, a normal operation is maintained in each of the electronic component chip C1 and the electronic component chip C2. Hence, the sensor package 1 is higher in operational reliability.

2. First Modification Example of First Example Embodiment

[Configuration of Sensor Package 1A]

Figure 4:
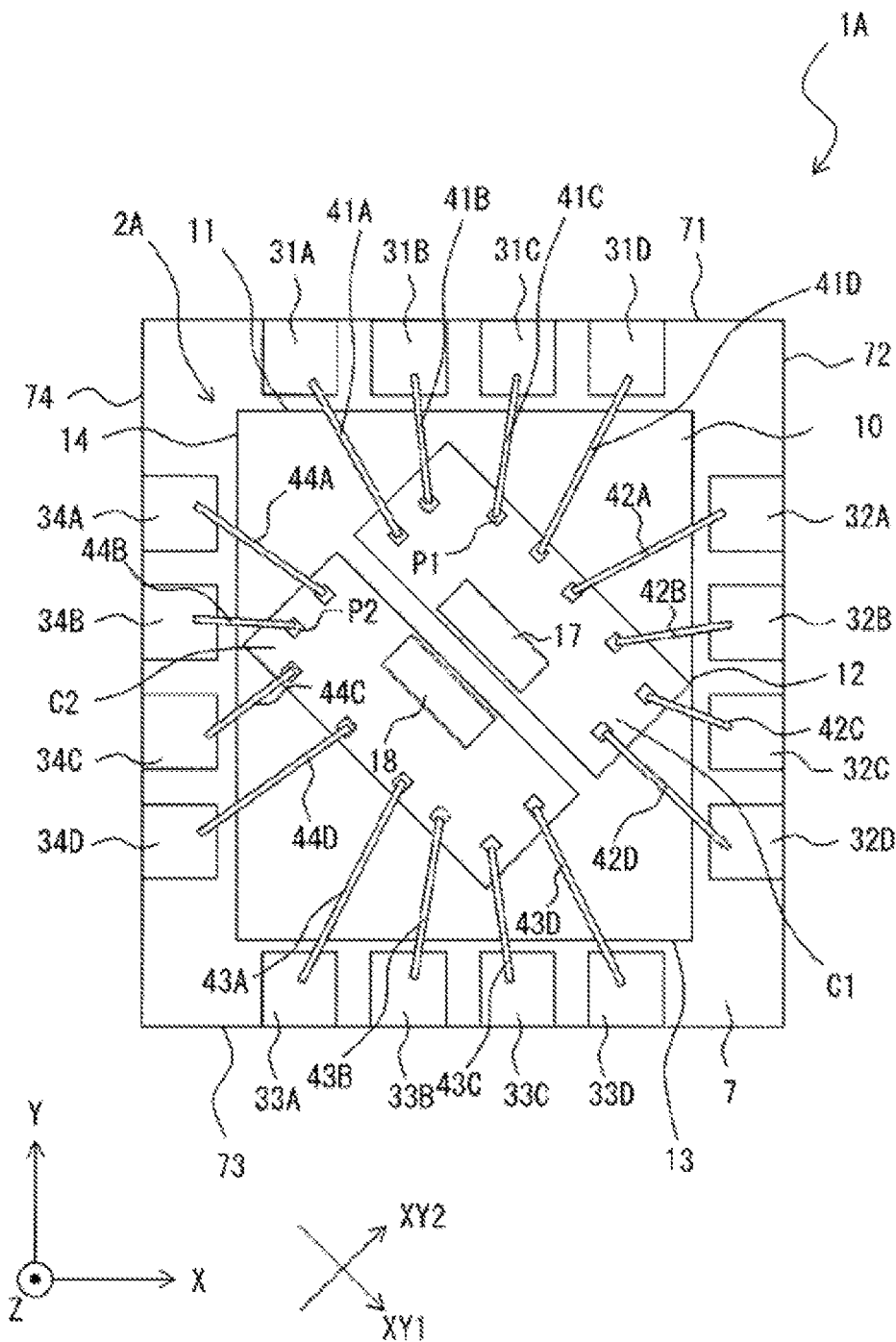
FIG. 4 is a planar diagram illustrating an overall configuration of a sensor package according to one modification example of one example embodiment of the disclosure.

FIG. 4 is a planar diagram illustrating an overall configuration example of a sensor package 1A according to a first modification example of the first example embodiment. The sensor package 1A according to the first modification example may include a sensor module 2A in place of the sensor module 2. The sensor package 1A may otherwise have substantially the same configuration as that of the sensor package 1.

In the sensor module 2A, the electronic component chip C1 and the electronic component chip C2 may be disposed in a different manner as compared with the sensor module 2 of the first embodiment. For example, the electronic component chip C1 and the electronic component chip C2 may each extend in a third direction XY1 different from both of the X-axis direction along the first side 11 (71) and the Y-axis direction along the second side 12 (72), and may be adjacent to each other in a fourth direction XY2 substantially orthogonal to the third direction XY1.

[Workings and Example Effects of Sensor Package 1A]

According to the sensor package 1A of the first modification example, the electronic component chip C1 and the electronic component chip C2 may each extend in an oblique direction with respect to the directions in which the first to fourth terminals 31 to 34 are arranged. As a result, the first leads 41 and the second leads 42 are arranged to extend radially toward the first terminals 31 and the second terminals 32 about the electronic component chip C1. Likewise, the third leads 43 and the fourth leads 44 are arranged to extend radially toward the third terminals 33 and the fourth terminals 34 about the electronic component chip C2. This makes it possible to further reduce a possibility of a contact between the first to fourth leads 41 to 44 as compared with the sensor package 1 illustrated in FIG. 1. It is thus possible to provide further improved operational reliability.

3. Second Modification Example of First Example Embodiment

[Configuration of Sensor Package 1B]

Figure 5:
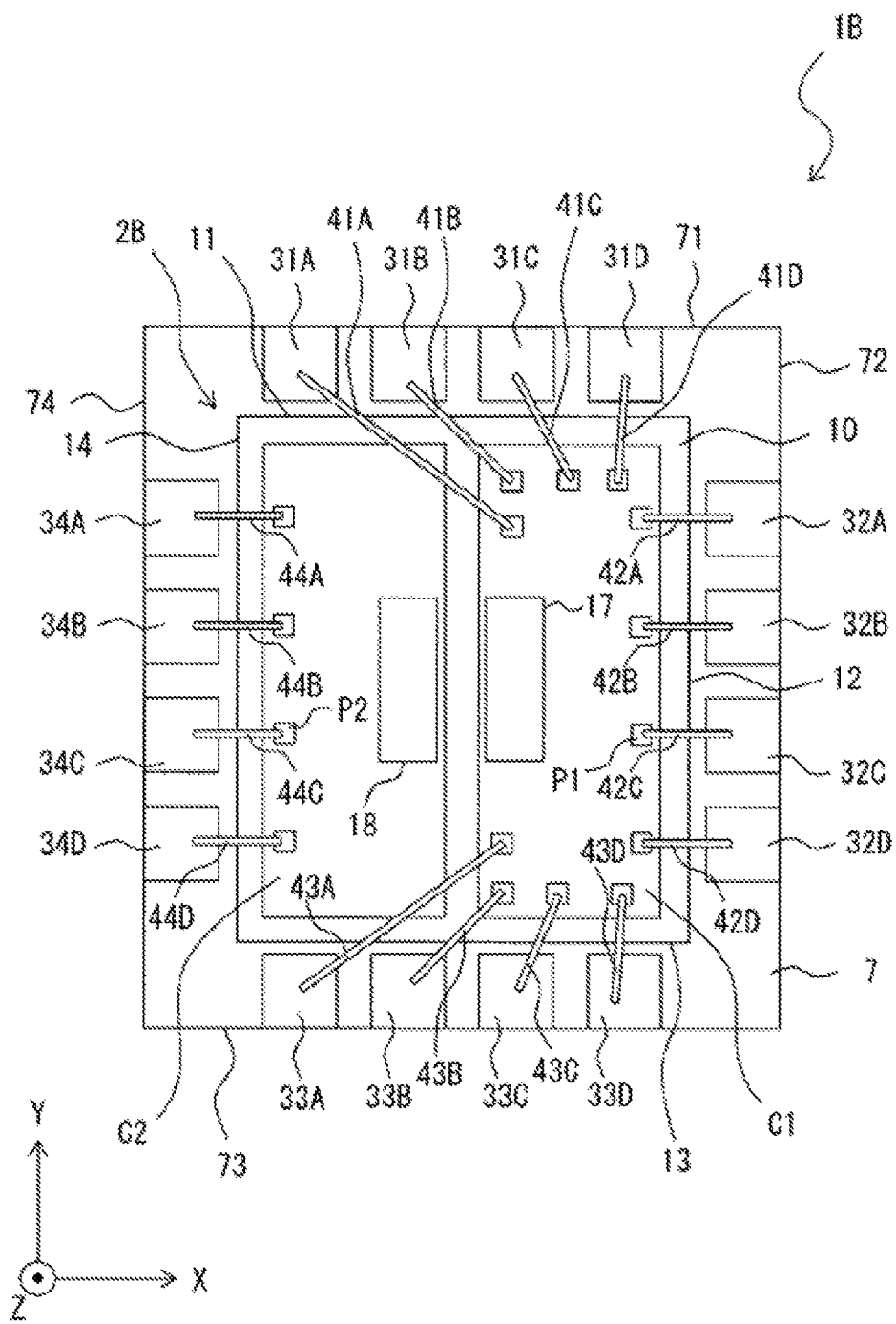
FIG. 5 is a planar diagram illustrating an overall configuration of a sensor package according to one modification example of one example embodiment of the disclosure.

FIG. 5 is a planar diagram illustrating an overall configuration example of a sensor package 1B according to a second modification example of the first example embodiment. The sensor package 1B according to the second modification example may include a sensor module 2B in place of the sensor module 2. The sensor package 1B may otherwise have substantially the same configuration as that of the sensor package 1.

In the sensor package 1 according to the first example embodiment described above, the first terminals 31A to 31D and the second terminals 32A to 32D are coupled to the electronic component chip C1 while being uncoupled to the electronic component chip C2. The third terminals 33A to 33D and the fourth terminals 34A to 34D may be coupled to the electronic component chip C2 while being uncoupled to the electronic component chip C1. According to the second modification example, however, the first terminals 31A to 31D, the second terminals 32A to 32D, and the third terminals 33A to 33D may be coupled to the electronic component chip C1 while being uncoupled to the electronic component chip C2, and the fourth terminals 34A to 34D may be coupled to the electronic component chip C2 while being uncoupled to the electronic component chip C1.

4. Third Modification Example of First Example Embodiment

[Configuration of Sensor Package 1C]

Figure 6:
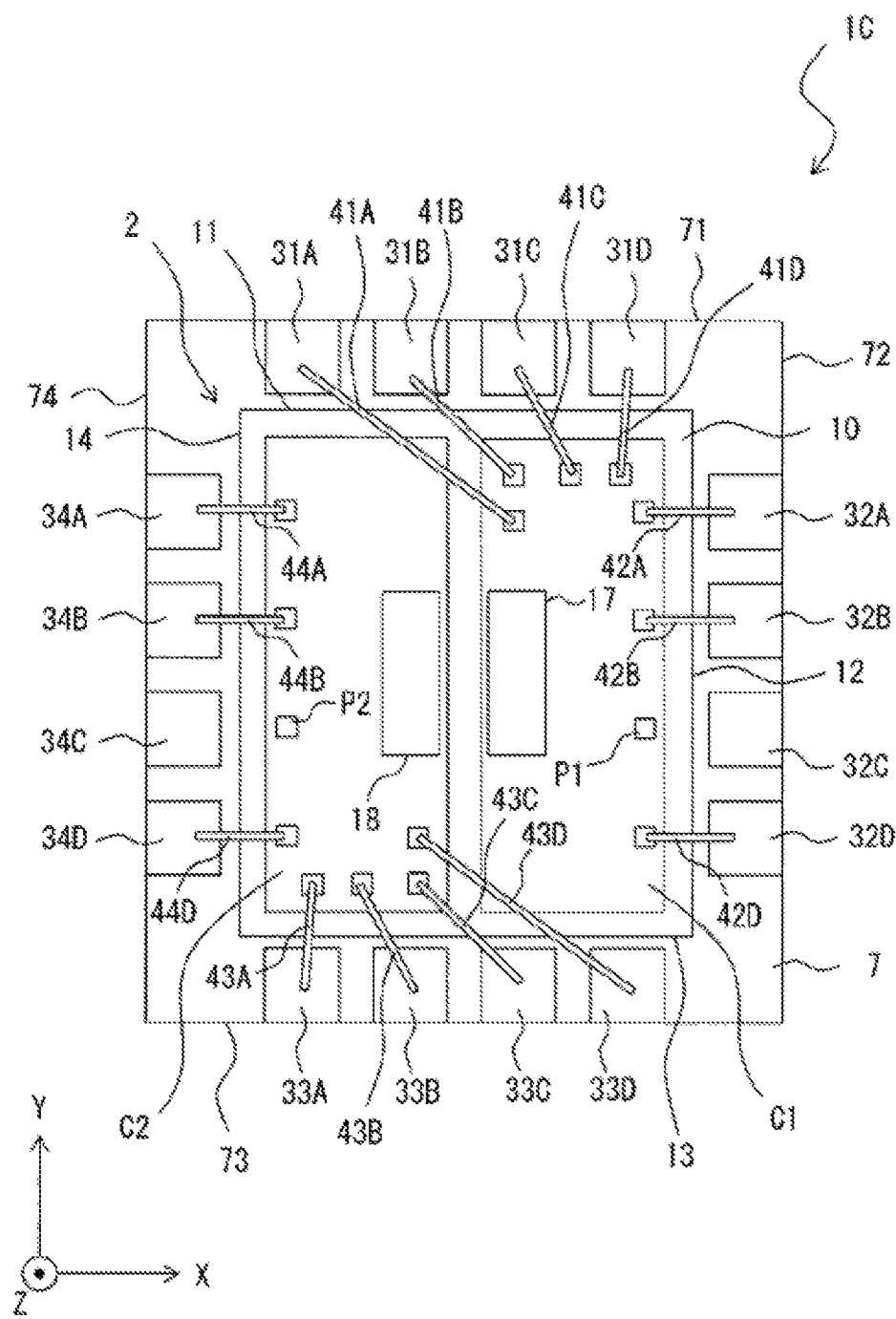
FIG. 6 is a planar diagram illustrating an overall configuration of a sensor package according to one modification example of one example embodiment of the disclosure.

FIG. 6 is a planar diagram illustrating an overall configuration example of a sensor package 1C according to a third modification example of the first example embodiment. In the sensor package 1C according to the third modification example, some of the first to fourth terminals 31 to 34 may be uncoupled to each of the electronic component chip C1 and the electronic component chip C2. FIG. 6 illustrates a specific but non-limiting example in which the second terminal 32C may be uncoupled to the pad P1 by omitting the second lead 42C, and the fourth terminal 34C may be uncoupled to the pad P2 by omitting the fourth lead 44C. In this way, as with the third modification example of the disclosure, only some of the plurality of terminals may be used depending on the application.

5. Second Example Embodiment

[Configuration of Sensor Package 8]

Figure 7A:
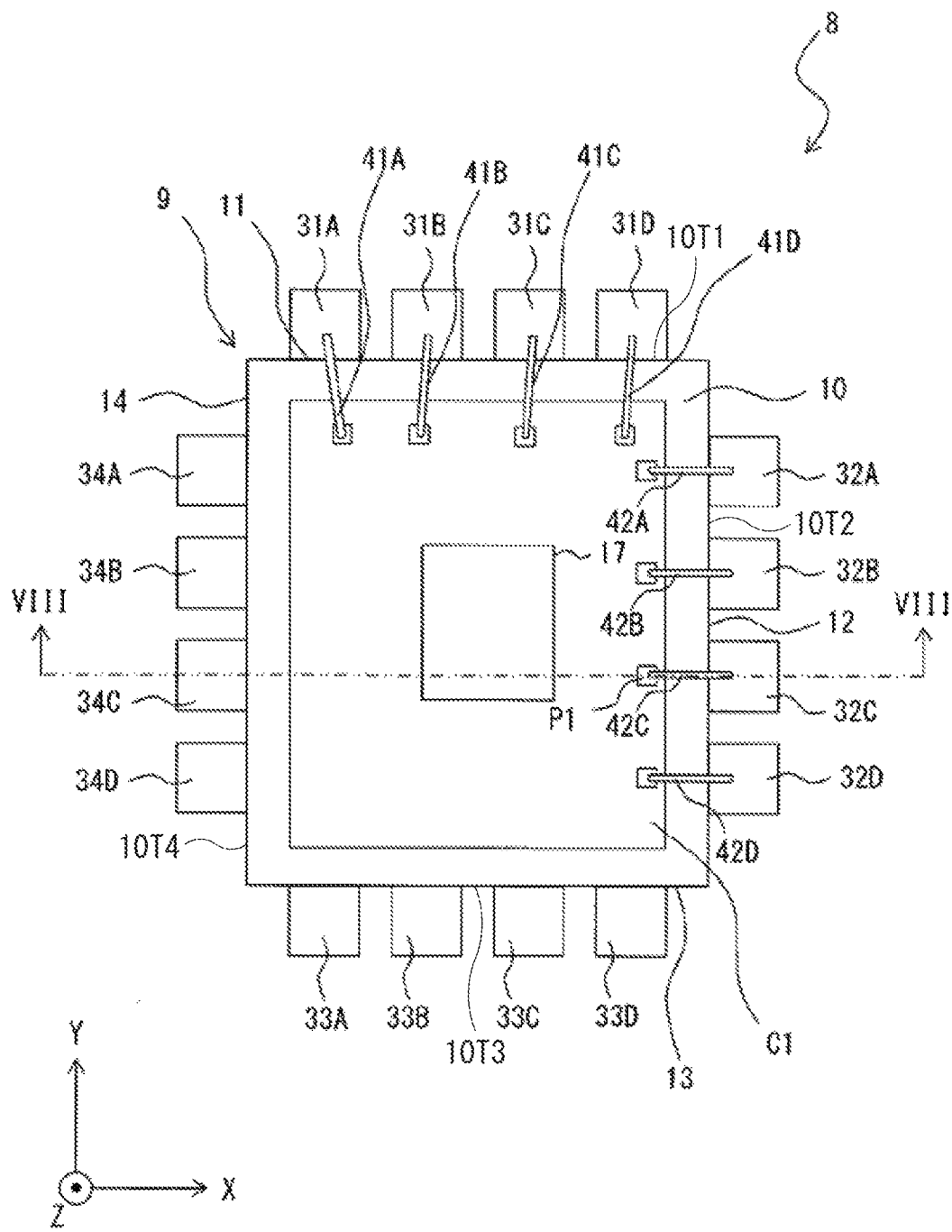
FIG. 7A is a first planar diagram illustrating an overall configuration of a sensor package according to one example embodiment of the disclosure.
Figure 7B:
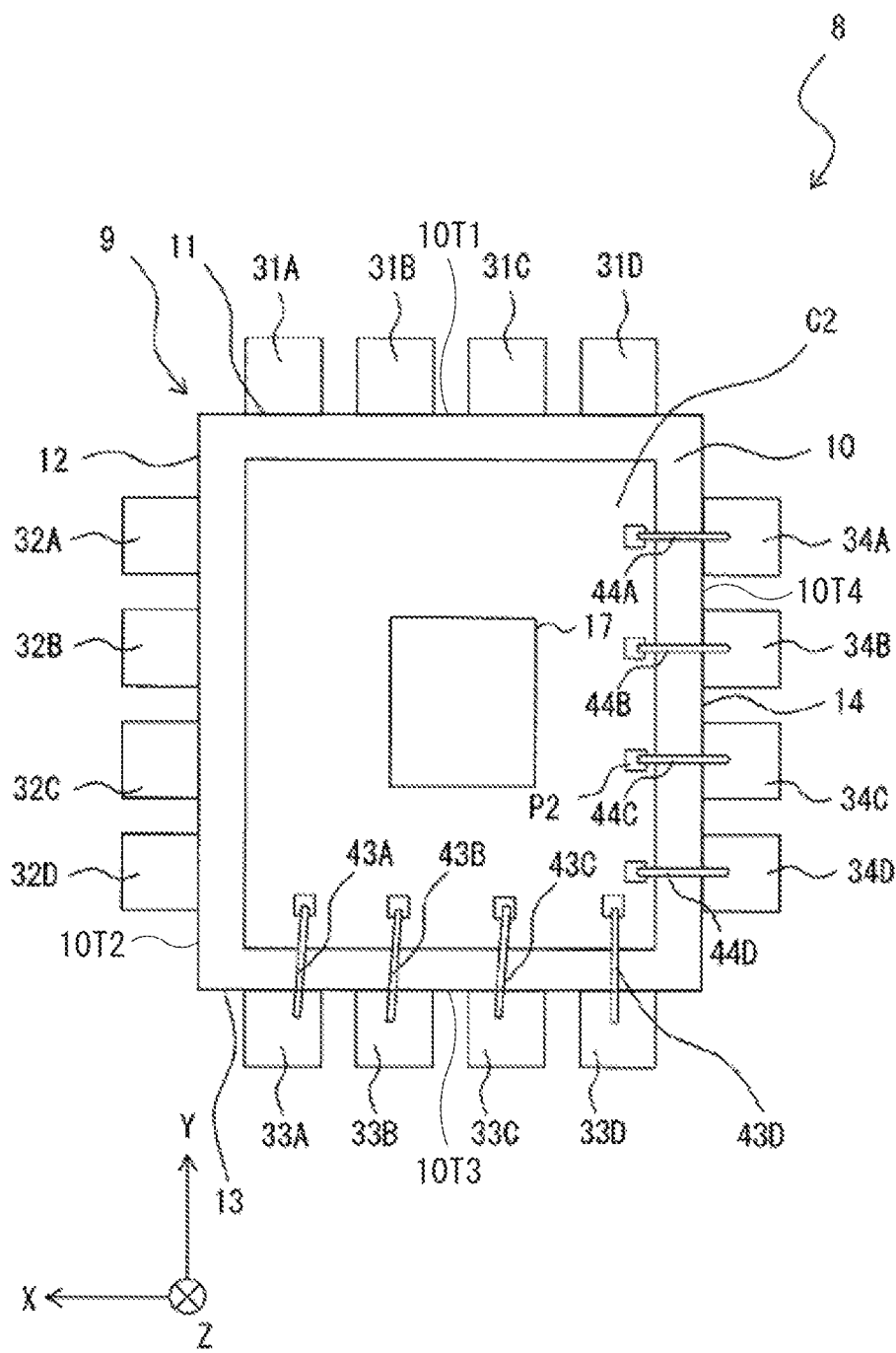
FIG. 7B is a second planar diagram illustrating an overall configuration of the sensor package according to one example embodiment of the disclosure.
Figure 8:
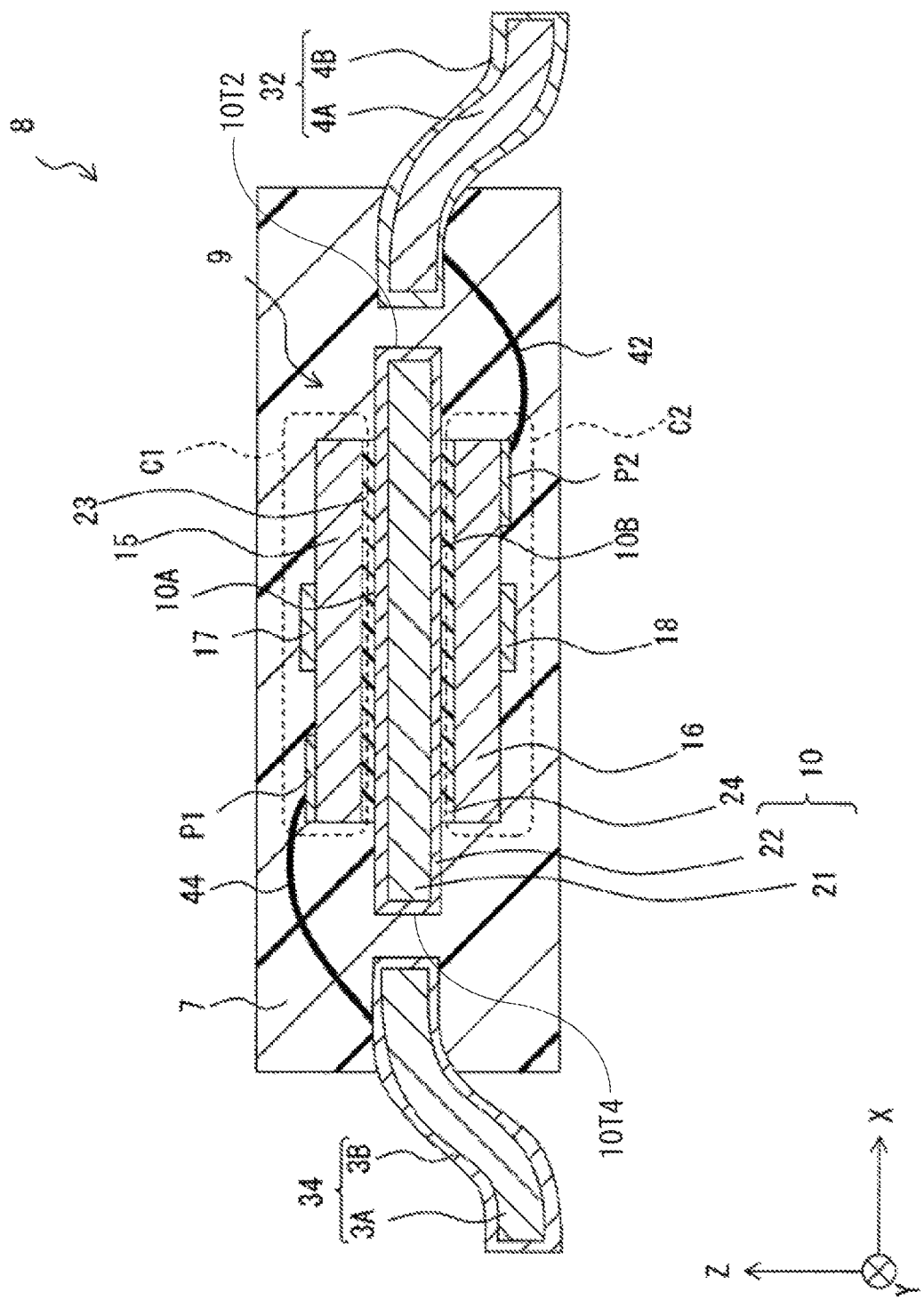
FIG. 8 is a cross-sectional diagram illustrating a configuration in a cross section of the sensor package illustrated in FIG. 7A.

Each of FIGS. 7A and 7B is a planar diagram illustrating an overall configuration example of a sensor package 8 according to a second example embodiment of the disclosure. FIG. 8 is a cross-sectional diagram illustrating the overall configuration example of the sensor package 8, and illustrates a cross section along line VIII-VIII in FIG. 7A as viewed in the direction of the arrows.

In the sensor module 2 of the sensor package 1 according to the foregoing first example embodiment, for example, the electronic component chip C1 and the electronic component chip C2 may both be provided on the first main surface 10A of the substrate 10 and may be adjacent to each other. In contrast, the sensor package 8 according to the second example embodiment may include a sensor module 9 in which the electronic component chip C1 is disposed on the first main surface 10A with the insulating layer 23 interposed therebetween, and the electronic component chip C2 is disposed on the second main surface 10B with an insulating layer 24 interposed therebetween.

In the sensor package 8, the first terminals 31A to 31D are provided along a first end face 10T1 including the first side 11, and the second terminals 32A to 32D are provided along a second end face 10T2 including the second side 12. Further, the third terminals 33A to 33D may be provided along a third end face 10T3 including the third side 13, and the fourth terminals 34A to 34D may be provided along a fourth end face 10T4 including the fourth side 14. Note that each of the first to fourth end faces 10T1 to 10T4 is a face of the substrate 10 that couples the first main surface 10A and the second main surface 10B to each other.

As illustrated in FIG. 7A, the first terminals 31A to 31D are coupled to corresponding ones of the pads P1 of the electronic component chip C1 via the first leads 41A to 41D, respectively. The second terminals 32A to 32D are coupled to corresponding ones of the pads P1 of the electronic component chip C1 via the second leads 42A to 42D, respectively.

As illustrated in FIG. 7B, the third terminals 33A to 33D may be coupled to corresponding ones of the pads P2 of the electronic component chip C2 via the third leads 43A to 43D, respectively. The fourth terminals 34A to 34D may be coupled to corresponding ones of the pads P2 of the electronic component chip C2 via the fourth leads 44A to 44D, respectively.

The sensor package 8 may otherwise have substantially the same configuration as that of the sensor package 1.

[Example Effects of Sensor Package 8]

As described above, in the sensor package 8 according to the second embodiment, the electronic component chip C1 and the electronic component chip C2 are disposed on respective opposite surfaces of the substrate 10. This helps to achieve reductions in in-plane dimensions.

Furthermore, the first leads 41 coupling the first terminals 31 to the pads P1 of the electronic component chip C1 and the second leads 42 coupling the second terminals 32 to the pads P1 of the electronic component chip C1 may be located on a first main-surface 10A side, while the third leads 43 coupling the third terminals 33 to the pads P2 of the electronic component chip C2 and the fourth leads 44 coupling the fourth terminals 34 to the pads P2 of the electronic component chip C2 may be located on a second main-surface 10B side. This makes it possible to sufficiently avoid contacts between the first leads 41 and the second leads 42 and contacts between the third leads 43 and the fourth leads 44. As a result, the risk of occurrence of a short circuit between the electronic component chip C1 and the electronic component chip C2 is reduced, which makes it possible to sufficiently avoid the risk of simultaneous malfunctions or failures of the electronic component chip C1 and the electronic component chip C2.

6. Other Modification Examples

The technology has been described hereinabove referring to the example embodiments and the modification examples. However, the technology is not limited thereto, and may be modified in a variety of ways. For example, regarding the foregoing example embodiments and modification examples, the sensor package that detects a variation in the external magnetic field associated with a displacement of a magnetic body has been described with a TMR element taken as an example of the sensor element. However, the electronic component package of an embodiment of the disclosure is not limited thereto. The electronic component package of an embodiment of the disclosure may be, for example, a sensor device that detects other physical quantities. Non-limiting examples of the sensor device may include an electric current detection device, a rotation detection device, a relative position detection device, a magnetic compass, and a magnetic switch. The electronic component package of an embodiment of the disclosure may also be a package that includes passive components such as a capacitor, an inductor, or a resistor, in addition to electronic components such as a semiconductor memory.

Factors such as the shape, size, and placement position of each component in the sensor package illustrated in figures such as FIG. 1 are merely illustrative and are non-limiting. It is not necessary to include all of the components in the sensor package illustrated in the figures such as FIG. 1, and any other unillustrated component may be included.

Further, the foregoing example embodiments and modification examples exemplify the case where two electronic component chips are provided; however, three or more electronic component chips may be provided.

Figure 11:
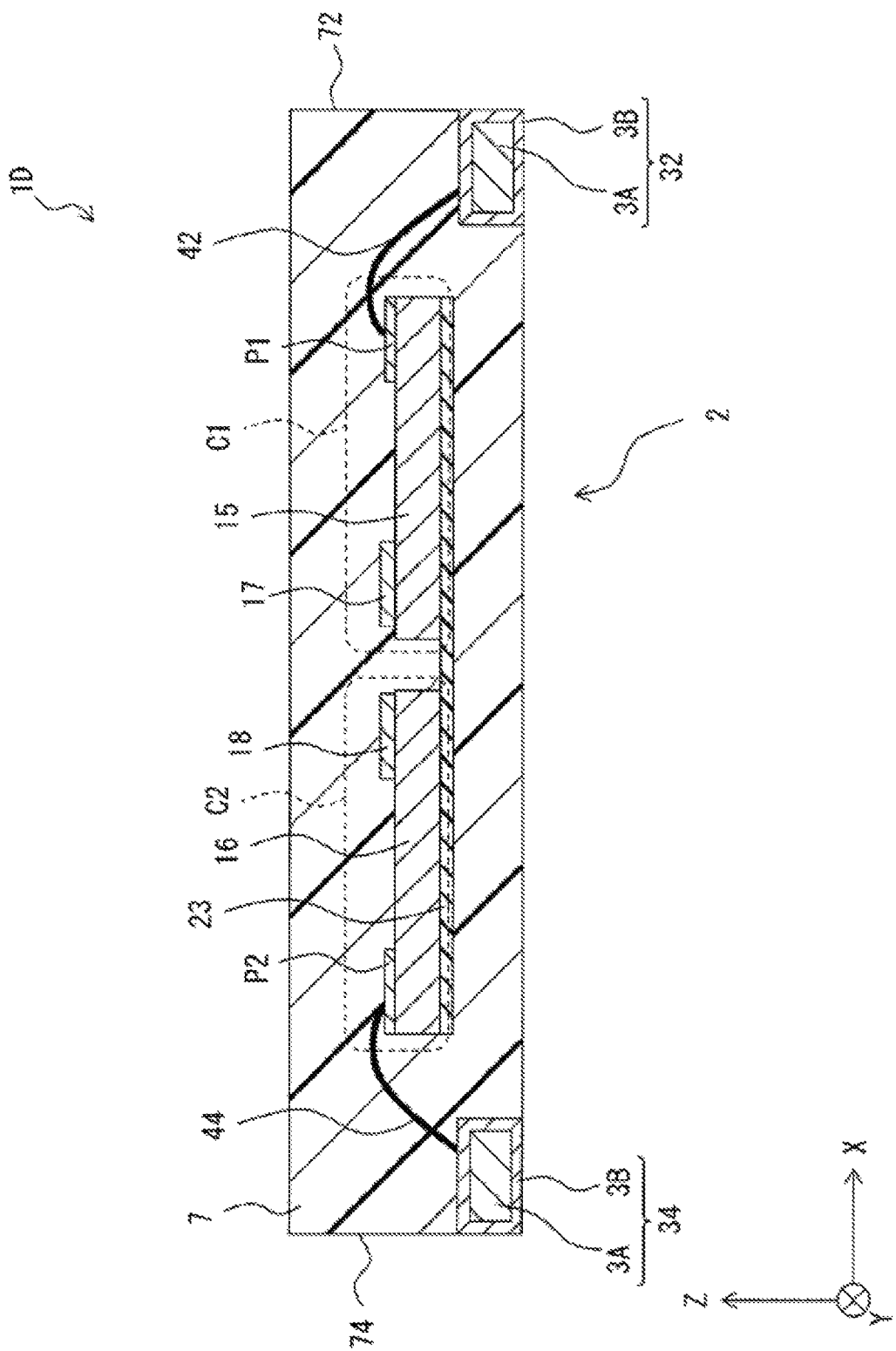
FIG. 11 is a cross-sectional diagram illustrating a configuration in a cross section of a sensor package according to one modification example of one example embodiment of the disclosure.

Moreover, in the sensor packages 1 and 1A to 1C of the foregoing example embodiment and modification examples, the electronic component chips C1 and C2 are provided on the substrate 10; however, the technology is not limited thereto. For example, like a sensor package 1D illustrated in FIG. 11, a structure may be employed where the substrate 10 is omitted and the sensor module 2 is held by the mold 7.

Furthermore, in the foregoing example embodiments and modification examples, the first to fourth leads 41 to 44 are described as a specific but non-limiting example of the "first to fourth conductors" in one embodiment of the disclosure; however, the "first to fourth conductors" in one embodiment of the disclosure are not limited to such wire-like components. The "first to fourth conductors" of an embodiment of the disclosure may be conductive thin films formable by, for example, plating, sputtering, printing, etc.

Moreover, the disclosure encompasses any possible combination of some or all of the various embodiments and the modification examples described herein and incorporated herein.

It is possible to achieve at least the following configurations from the foregoing embodiments and modification examples of the disclosure.

(1) An electronic component package having an outer edge including a first side and a second side adjacent to each other, the electronic component package including:
a first electronic component chip;
a second electronic component chip provided at a distance from the first electronic component chip;
one or more first terminals disposed along the first side;
one or more second terminals disposed along the second side; and
one or more first conductors that couple the one or more first terminals to the first electronic component chip, with the one or more first terminals being uncoupled to the second electronic component chip.

(2) The electronic component package according to (1), further including one or more second conductors that couple the one or more second terminals to the first electronic component chip, with the one or more second terminals being uncoupled to the second electronic component chip.

(3) The electronic component package according to (1) or (2), further including a substrate having a first main surface and a second main surface opposite to the first main surface, in which the first electronic component chip and the second electronic component chip are both provided on the first main surface.

(4) The electronic component package according to (3), in which
the outer edge has a substantially rectangular shape in a plan view, with the first side and the second side being substantially orthogonal to each other, and
the first electronic component chip and the second electronic component chip are adjacent to each other in a first direction along the first side, and each extend in a second direction along the second side.

(5) The electronic component package according to (3), in which
the outer edge has a substantially rectangular shape in a plan view, with the first side and the second side being substantially orthogonal to each other, and
the first electronic component chip and the second electronic component chip each extend in a third direction different from both of a first direction along the first side and a second direction along the second side, and are adjacent to each other in a fourth direction substantially orthogonal to the third direction.

(6) The electronic component package according to (4) or (5), further including one or more third terminals, one or more fourth terminals, one or more third conductors, and one or more fourth conductors, in which
the outer edge further includes a third side opposed to the first side, and a fourth side opposed to the second side,
the one or more third terminals are disposed along the third side,
the one or more fourth terminals are disposed along the fourth side,
the one or more third terminals are coupled to the second electronic component chip by the one or more third conductors while being uncoupled to the first electronic component chip, and
the one or more fourth terminals are coupled to the second electronic component chip by the one or more fourth conductors while being uncoupled to the first electronic component chip.

(7) The electronic component package according to (4) or (5), further including one or more third terminals, one or more fourth terminals, one or more third conductors, and one or more fourth conductors, in which
the outer edge further includes a third side opposed to the first side, and a fourth side opposed to the second side,
the one or more third terminals are disposed along the third side,
the one or more fourth terminals are disposed along the fourth side,
the one or more third terminals are coupled to the first electronic component chip by the one or more third conductors while being uncoupled to the second electronic component chip, and
the one or more fourth terminals are coupled to the second electronic component chip by the one or more fourth conductors while being uncoupled to the first electronic component chip.

(8) The electronic component package according to (1) or (2), further including a substrate having a first main surface and a second main surface opposite to the first main surface, in which
the first electronic component chip is provided on the first main surface, and the second electronic component chip is provided on the second main surface.

(9) An electronic component package including:
a substrate having a first main surface, a second main surface opposite to the first main surface, and a first end face and a second end face each coupling the first main surface and the second main surface to each other;
a first electronic component chip provided on the first main surface;
a second electronic component chip provided on the second main surface;
one or more first terminals provided along the first end face;
one or more second terminals provided along the second end face;
one or more first conductors that couple the one or more first terminals to the first electronic component chip; and
one or more second conductors that couple the one or more second terminals to the second electronic component chip.

(10) The electronic component package according to any one of (3) to (9), in which
the substrate includes a base, and a plating layer covering all or a part of the base, and
the plating layer includes a metal material that is less likely to undergo an ion migration phenomenon than silver.

(11) The electronic component package according to (10), in which the metal material includes one or more of gold, palladium, and nickel.

(12) The electronic component package according to any one of (1) to (11), in which the first electronic component chip and the second electronic component chip are of substantially a same type.

(13) The electronic component package according to any one of (1) to (12), in which the first electronic component chip includes a first application-specific integrated circuit and a first sensor.

(14) The electronic component package according to (13), in which the first sensor includes a magnetic sensor.

(15) The electronic component package according to any one of (1) to (14), in which the second electronic component chip includes a second application-specific integrated circuit and a second sensor.

(16) The electronic component package according to (15), in which the second sensor includes a magnetic sensor.

(17) The electronic component package according to any one of (1) to (8), further including a mold covering all or a part of the first electronic component chip and all or a part of the second electronic component chip, in which
a portion of the mold is included in each of all or a part of the first side and all or a part of the second side.

According to the electronic component package of at least one embodiment of the disclosure, the one or more first terminals are disposed along the first side, and the one or more second terminals are disposed along the second side. Thus, a larger number of first terminals and a larger number of second terminals are disposed while avoiding an increase in the planar area of the substrate. Furthermore, the one or more first terminals and the one or more second terminals are both coupled to the first electronic component chip by the one or more first conductors while being uncoupled to the second electronic component chip. Moreover, even in a case where a plurality of first terminals is disposed along the first side, the plurality of first terminals is all coupled to the first electronic component chip by a plurality of first conductors while being uncoupled to the second electronic component chip. As a result, even if the electronic component package is reduced in size, a risk of occurrence of a short circuit between the first electronic component chip and the second electronic component chip is reduced. It is thus possible to dispose the first electronic component chip and the second electronic component chip in close proximity to each other. This reduces an error dependent on the placement position of each of the first electronic component chip and the second electronic component chip even in a case of measuring a physical quantity dependent on the position, such as a magnetic field strength.

According to the electronic component package of at least one embodiment of the disclosure, the first electronic component chip and the second electronic component chip are respectively provided on the first main surface and the second main surface of a single substrate. The one or more first terminals are provided along the first end face of the substrate. The one or more second terminals are provided along the second end face of the substrate. This helps to achieve size reduction of the entire electronic component package, as well as reduction of a risk of occurrence of a short circuit between the first electronic component chip and the second electronic component chip.

According to the electronic component package of at least one embodiment of the disclosure, it is possible to provide higher operational reliability while achieving size reduction.

It should be understood that effects of the embodiments or modification examples of the disclosure should not be limited to those described herein, and other effects may be achieved.

Although the disclosure is described hereinabove in terms of the example embodiments, modification examples, and application examples, it is not limited thereto. It should be appreciated that variations may be made in the described example embodiments, modification examples, and application examples by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. The use of the terms first, second, etc. do not denote any order or importance, but rather the terms first, second, etc. are used to distinguish one element from another. The term "substantially" and its variants are defined as being largely but not necessarily wholly what is specified as understood by one of ordinary skill in the art. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:
1. An electronic component package including an outer edge that includes a first side and a second side adjacent to each other, the electronic component package comprising:
a first electronic component chip;
a second electronic component chip at a distance from the first electronic component chip;
one or more first terminals along the first side;
one or more second terminals along the second side;

one or more first conductors that respectively couple at least one of the one or more first terminals to the first electronic component chip, with the one or more first terminals being uncoupled to the second electronic component chip; and one or more second conductors that respectively couple at least one of the one or more second terminals to the first electronic component chip, with the one or more second terminals being uncoupled to the second electronic component chip, wherein the one or more first terminals and the one or more second terminals are exposed on the outer edge;

all of the one or more first terminals and all of the one or more second terminals are electrically insulated from the second electronic component chip;

the one or more first terminals are the only terminals along the first side; and the one or more second terminals are the only terminals along the second side.

2. The electronic component package according to claim 1, further comprising a substrate having a first main surface and a second main surface opposite to the first main surface, wherein the first electronic component chip and the second electronic component chip are on the first main surface.

3. The electronic component package according to claim 2, wherein the outer edge has a substantially rectangular shape in a plan view, with the first side and the second side being substantially orthogonal to each other, and the first electronic component chip and the second electronic component chip are adjacent to each other in a first direction along the first side, and each extend in a second direction along the second side.

4. The electronic component package according to claim 2, wherein the outer edge has a substantially rectangular shape in a plan view, with the first side and the second side being substantially orthogonal to each other, and the first electronic component chip and the second electronic component chip each extend in a third direction different from both of a first direction along the first side and a second direction along the second side, and are adjacent to each other in a fourth direction substantially orthogonal to the third direction.

5. The electronic component package according to claim 3, further comprising one or more third terminals, one or more fourth terminals, one or more third conductors, and one or more fourth conductors, wherein the outer edge includes a third side opposed to the first side and a fourth side opposed to the second side, the one or more third terminals are along the third side, the one or more fourth terminals are along the fourth side, the one or more third terminals are coupled to the second electronic component chip by the one or more third conductors while being uncoupled to the first electronic component chip, the one or more fourth terminals are coupled to the second electronic component chip by the one or more fourth conductors while being uncoupled to the first electronic component chip, all of the third terminals and all of the fourth terminals are electrically insulated from the first electronic component chip, the one or more third terminals are the only terminals along the third side, and the one or more fourth terminals are the only terminals along the fourth side.

6. The electronic component package according to claim 3, further comprising one or more third terminals, one or more fourth terminals, one or more third conductors, and one or more fourth conductors, wherein the outer edge includes a third side opposed to the first side, and a fourth side opposed to the second side, the one or more third terminals are along the third side, the one or more fourth terminals are along the fourth side, the one or more third terminals are coupled to the first electronic component chip by the one or more third conductors while being uncoupled to the second electronic component chip, the one or more fourth terminals are coupled to the second electronic component chip by the one or more fourth conductors while being uncoupled to the first electronic component chip, all of the third terminals are electrically insulated from the second electronic component chip, all of the fourth terminals are electrically insulated from the first electronic component chip, the one or more third terminals are the only terminals along the third side, and the one or more fourth terminals are the only terminals along the fourth side.

7. The electronic component package according to claim 1, further comprising a substrate having a first main surface and a second main surface opposite to the first main surface, wherein the first electronic component chip is provided on the first main surface, and the second electronic component chip is provided on the second main surface.

8. The electronic component package according to claim 2, wherein the substrate includes a base, and a plating layer covering all or a part of the base, and the plating layer includes a metal material that is less likely to undergo an ion migration phenomenon than silver.

9. The electronic component package according to claim 8, wherein the metal material includes one or more of gold, palladium, and nickel.

10. The electronic component package according to claim 1, wherein the first electronic component chip and the second electronic component chip are of substantially a same type.

11. The electronic component package according to claim 1, wherein the first electronic component chip includes a first application-specific integrated circuit and a first sensor.

12. The electronic component package according to claim 11, wherein the first sensor comprises a magnetic sensor.

13. The electronic component package according to claim 1, wherein the second electronic component chip includes a second application-specific integrated circuit and a second sensor.

14. The electronic component package according to claim 13, wherein the second sensor comprises a magnetic sensor.

15. The electronic component package according to claim 1, further comprising a mold covering all or a part of the first electronic component chip and all or a part of the second electronic component chip, wherein a portion of the mold is included in each of all or a part of the first side and all or a part of the second side.

* * * * *